United States Patent [19]

Dorri et al.

[11] Patent Number: 5,428,292
[45] Date of Patent: Jun. 27, 1995

[54] PANCAKE MRI MAGNET WITH MODIFIED IMAGING VOLUME

[75] Inventors: Bizhan Dorri, Clifton Park; Evangelos T. Laskaris, Schenectady, both of N.Y.

[73] Assignee: General Electric Company, Schenectady, N.Y.

[21] Appl. No.: 237,516

[22] Filed: Apr. 29, 1994

[51] Int. Cl.[6] .............................................. G01V 3/00
[52] U.S. Cl. ...................................... 324/319; 335/296
[58] Field of Search .............. 324/319, 320, 318, 322, 324/307, 309, 300; 128/653.5; 335/296, 297, 299; 505/844

[56] References Cited

U.S. PATENT DOCUMENTS

| | | | |
|---|---|---|---|
| 4,500,860 | 2/1985 | Vermilyea | 335/216 |
| 4,506,247 | 5/1985 | Vermilyea | 335/216 |
| 4,509,030 | 4/1985 | Vermilyea | 335/216 |
| 4,523,166 | 6/1985 | Gross | 335/216 |
| 4,581,580 | 4/1986 | Keim | 324/318 |
| 4,724,412 | 2/1988 | Kalafala | 335/299 |
| 4,875,485 | 10/1989 | Matsutani | 324/319 |
| 4,924,198 | 5/1990 | Laskaris | 335/216 |
| 4,986,078 | 1/1991 | Laskaris | 62/51.1 |
| 5,006,804 | 4/1991 | Dorri et al. | 324/320 |
| 5,117,188 | 5/1992 | Ohkawa | 335/296 |
| 5,291,169 | 3/1994 | Ige et al. | 335/216 |
| 5,359,310 | 10/1994 | Pissanetzky | 324/319 |

OTHER PUBLICATIONS

HARC (Houston Advanced Research Center), Sales Brochure entitled "Introducing New Technology for MRI Magnets with Unprecedented Patient Access": (1992 month of Pub. unknown).

U.S. Patent Application Serial No. 08/223,200, filed Apr. 4, 1994, entitled "Open MRI Magnet with Unifrom Magnetic Field", Laskaris et al.

*Primary Examiner*—Louis Arana
*Attorney, Agent, or Firm*—Douglas E. Erickson; Paul R. Webb, II

[57] ABSTRACT

A pancake magnetic resonance imaging (MRI) magnet having a superconductive coil assembly including a toroidal-shaped coil housing containing a superconductive main coil set and a radially spaced-apart superconductive supplemental coil set. The main coil set includes a first main coil located radially towards the circumferential outside surface which faces away from the bore, and the supplemental coil set includes three radially spaced-apart supplemental coils located radially towards the circumferential outside surface which faces towards the bore. The first main coil and the middle supplemental coil each carry an equal electric current in a first direction while the other two supplemental coils each carry the same electric current in the opposite direction. Such coil arrangement produces an imaging volume longitudinally wider than the longitudinal thickness of the magnet. By adding a sufficient number of additional main coils and by longitudinally offsetting certain coils, the spherical imaging volume may be changed to a longitudinally offset ellipsoidal imaging volume. Such imaging volumes are better designed for breast imaging.

10 Claims, 3 Drawing Sheets

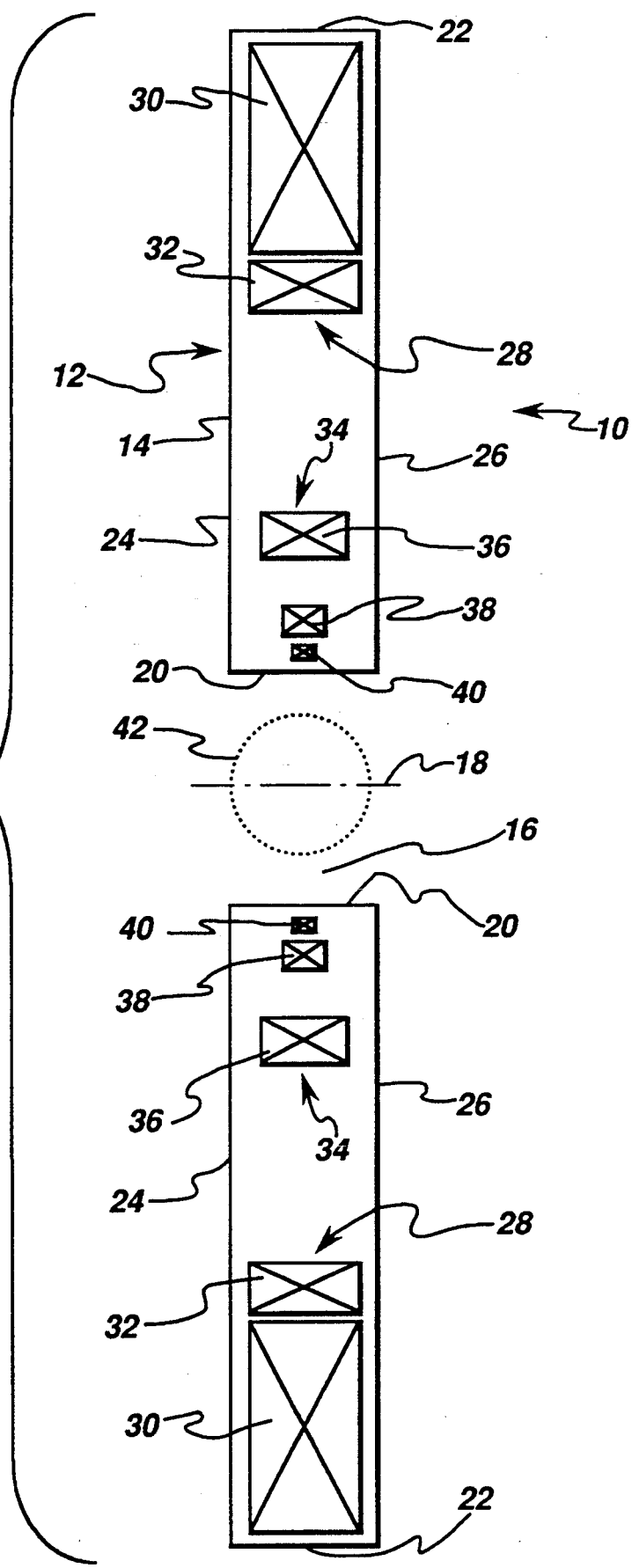

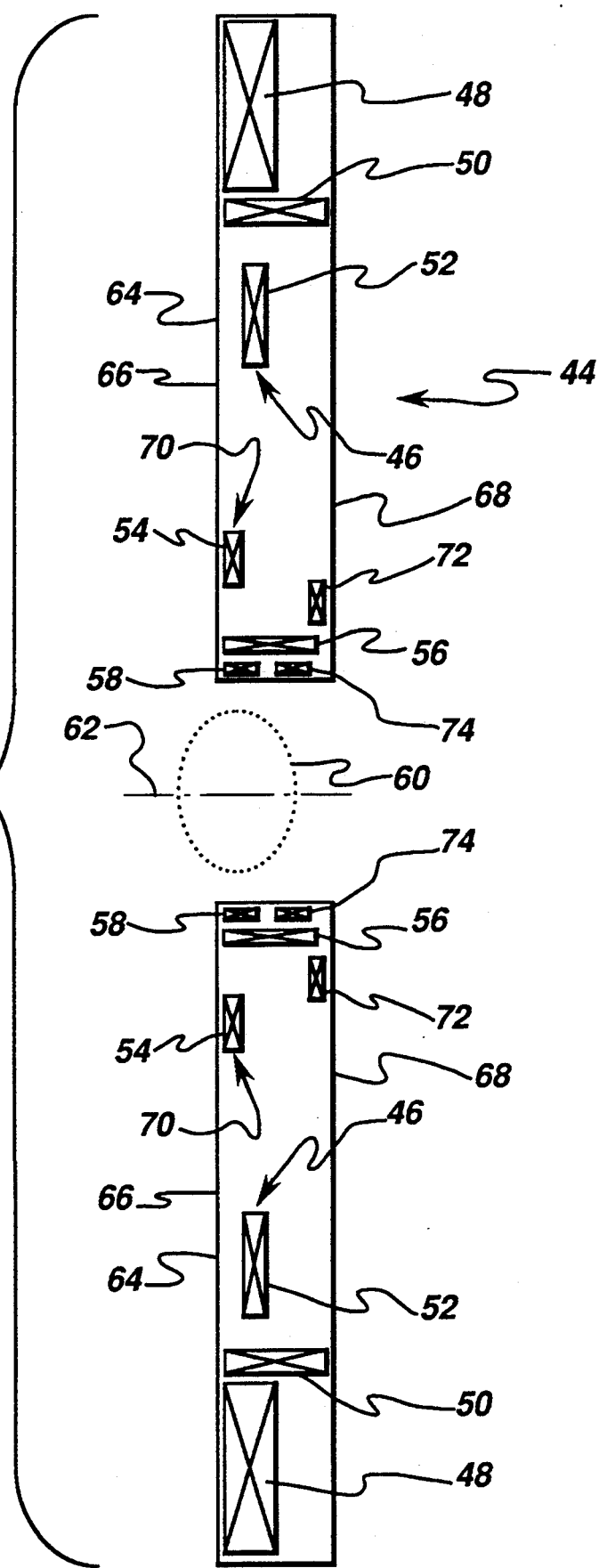

5,428,292

PANCAKE MRI MAGNET WITH MODIFIED IMAGING VOLUME

BACKGROUND OF THE INVENTION

The present invention relates generally to a superconductive magnet used to generate a high magnetic field as part of a magnetic resonance imaging (MRI) diagnostic system, and more particularly to such a magnet having a pancake (i.e., flat) design for imaging specific parts of the human body, such as the breast.

MRI systems employing superconductive magnets are used in various fields such as medical diagnostics. Known superconductive magnets include liquid-helium cooled and cryocooler-cooled superconductive magnets. Typically, for a cryocooler-cooled magnet, the superconductive coil assembly includes a superconductive main coil surrounded by a thermal shield surrounded by a vacuum enclosure. A cryocooler coldhead is externally mounted to the vacuum enclosure, has its first stage in thermal contact with the thermal shield, and has its second stage in thermal contact with the superconductive main coil.

Superconductive magnets have been mentioned in a sales brochure which claim a 15 centimeter thick pancake superconductive coil assembly magnet for breast imaging within a 10 centimeter-diameter spherical imaging volume of 1 Tesla having a pre-shim inhomogeneity of 10 parts per million (ppm) and which claim an under-the-table or behind-the-wall superconductive magnet having a 20 centimeter-diameter spherical imaging volume of 0.5 Tesla having a 10 ppm inhomogeneity with the imaging volume located outside the magnet. However, such designs have not been disclosed.

Known superconductive magnets include those having a tubular-shaped superconductive coil assembly with one or more longitudinally spaced-apart main coils carrying an equal electric current in a first direction for generating a high magnetic field within the spherical imaging volume of the magnet's bore. Correction coils may be placed within the superconductive coil assembly radially near and radially inward of the main coils for shimming the magnet to correct for slight magnetic field inhomogeneities caused by manufacturing tolerances and/or field site disturbances to the magnetic field of the magnet. Each correction coil carries a different, but low, electric current in any required direction including a direction opposite to the direction of the electric current carried in the main coils. Shielding coils may also be used within the superconductive coil assembly to prevent the high magnetic field created by and surrounding the main coils from adversely interacting with electronic equipment in the vicinity of the magnet. Such shielding coils carry electric current of generally equal amperage, but in an opposite direction, to the electric current carried in the main coils and are positioned radially outward of the main coils.

What is needed is a relatively inexpensive superconductive MRI magnet having an imaging volume which is modified (in size and/or shape) to more accurately match the specific part of the human body to be imaged.

SUMMARY OF THE INVENTION

It is an object of the invention to provide a compact superconductive MRI magnet having an imaging volume modified for breast imaging.

The pancake magnetic resonance imaging (MRI) magnet of the invention has a superconductive coil assembly. The coil assembly includes a generally toroidal-shaped coil housing, a main coil set, and a supplemental coil set. The housing surrounds a bore and has a generally longitudinal axis. The housing also has a radial thickness between a first generally-circumferential outside surface facing generally towards the axis and a radially spaced-apart second generally-circumferential outside surface facing generally away from the axis. The housing further has a longitudinal thickness between longitudinally spaced-apart first and second generally-annular outside surfaces facing generally away from each other. The radial thickness is greater than the longitudinal thickness. The main coil set is generally coaxially aligned with the axis and positioned within the housing radially towards said second circumferential outside surface. The main coil set includes a generally annular-shaped superconductive first main coil carrying an electric current in a first direction. The supplemental coil set is generally coaxially aligned with the axis, is positioned within the housing radially towards the first circumferential outside surface, and is radially spaced apart from the main coil set. The supplemental coil set includes, in order of decreasing radial distance from the axis, adjacently radially spaced-apart and generally annular-shaped superconductive first, second, and third supplemental coils. The second supplemental coil carries an electric current in the first direction, and the first and third supplemental coils each carry an electric current in a direction opposite to the first direction.

In an exemplary embodiment, the first main coil is positioned longitudinally towards one of the first and second annular outside surfaces, the main coil set includes a second main coil adjacently radially spaced apart from and positioned radially inward of the first main coil, and the first, second and third supplemental coils are each positioned longitudinally towards the one of the first and second annular outside surfaces.

Several benefits and advantages are derived from the invention. Applicants' compact pancake MRI magnet design with its basic main and supplemental coil sets is designed, using conventional magnetic field analysis, to produce a high magnetic field with low inhomogeneity within a generally spherical imaging volume having a diameter greater than the longitudinal thickness of the housing. In Applicants' exemplary embodiment, the imaging volume is designed, using conventional magnetic field analysis, to be a generally ellipsoidal imaging volume longitudinally extending beyond the one of the first and second annular outside surfaces. Such extension of the imaging volume beyond an annular outside surface of the housing, especially for an ellipsoidal-shaped imaging volume, gives an imaging volume which more closely matches the size and shape of various parts of the human body to be imaged, such as the breast.

BRIEF DESCRIPTION OF THE DRAWINGS

The accompanying drawings illustrate two preferred embodiments of the present invention wherein:

FIG. 2 is a schematic cross-sectional side-elevational view of the MRI magnet of FIG. 1 showing a first preferred arrangement of magnet coils designed to produce a spherical imaging volume having a diameter greater than the longitudinal thickness of the coil assembly's housing; and FIG. 3 is a schematic cross-sectional side-elevational view of the MRI magnet of FIG. 1 showing a second preferred arrangement of magnet coils designed to produce an ellipsoidal imaging volume extending longitudinally beyond one of the annular outside surfaces of the coil assembly's housing.

DETAILED DESCRIPTION OF THE INVENTION

Figure 1:
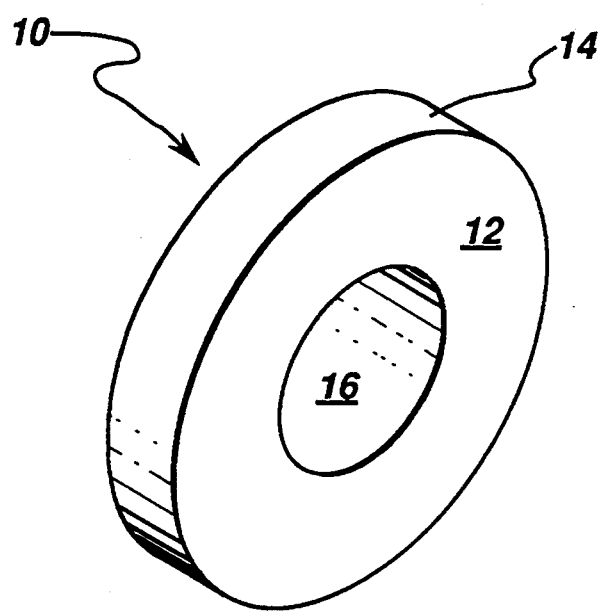
FIG. 1 is a perspective view of the pancake MRI magnet of the invention.

Referring now to the drawings, wherein like numerals represent like elements throughout, FIGS. 1–2 show a first preferred embodiment of the pancake magnetic resonance imaging (MRI) magnet 10 of the present invention. The magnet 10 comprises a superconductive coil assembly 12. The superconductive coil assembly 12 includes a generally toroidal-shaped coil housing 14 which surrounds a bore 16 and which has a generally longitudinal axis 18. The housing 14 also has a radial thickness between a first generally-circumferential outside surface 20 facing generally towards the axis 18 and a radially spaced-apart second generally-circumferential outside surface 22 facing generally away from the axis 18. The housing 14 further has a longitudinal thickness between longitudinally spaced-apart first and second generally-annular outside surfaces 24 and 26 facing generally away from each other. The housing's radial thickness is greater than its longitudinal thickness, and preferably the radial thickness is at least equal to generally four times the longitudinal thickness. Such pancake magnet 10 is seen from FIGS. 1–2 to have a relatively flat, ring-like shape.

The superconductive coil assembly 12 also includes a main coil set 28 generally coaxially aligned with the axis 18 and disposed within the housing 14 radially towards the second circumferential outside surface 22. The main coil set 28 includes a generally annular-shaped superconductive first main coil 30 carrying an electric current in a first direction. The first direction is defined to be either a clockwise or a counterclockwise circumferential direction about the axis 18 with any slight longitudinal component of current direction being ignored. Preferably, the main coil set 28 also includes a second main coil 32 adjacently radially spaced apart from and disposed radially inward of the first main coil 30. The second main coil 32 (as well as any additional main coil) carries an electric current in the first direction (i.e., in the same direction as the electric current in the first main coil 30). The main coils 30 and 32 are supported on coil forms which are attached to the housing (such coil forms and attachment being conventional and not shown in the figures).

It is noted that the main coil set 28 has been said to be generally coaxially aligned with the axis 18 and disposed within the housing 14 radially towards the second circumferential outside surface 22. A coil set is said to be generally coaxially aligned with an axis and disposed within a housing radially towards one of two spaced apart surfaces when each of its coils is generally coaxially aligned with the axis and disposed within the housing radially closer to the one surface than to the other surface. Thus, the first and second main coils 30 and 32 are each generally coaxially aligned with the axis 18 and disposed within the housing 14 radially closer to the second circumferential outside surface 22 than to the first circumferential outside surface 20.

It is further noted that the second main coil 32 has been said to be adjacently radially spaced apart from the first main coil 30. A first coil is said to be adjacently radially spaced apart from a second coil when the first coil is radially spaced apart from the second coil and no other coil is radially interposed between the first and second coils. In other words, no other coil intersects a radial line (i.e., a line drawn perpendicular to the longitudinal axis 18) between the first and second coils.

Preferably, the first main coil 30 is alone (i.e., the only coil) within a space defined by moving the first main coil 30 longitudinally between the first and second annular outside surfaces 24 and 26. Likewise, it is preferred that the second main coil 32 is alone (i.e., the only coil) within a space defined by moving the second main coil 32 longitudinally between the first and second annular outside surfaces 24 and 26. Such arrangement ensures that the housing 14 is relatively thin (i.e., the housing 14 has a relatively small longitudinal thickness compared to its radial thickness).

The superconductive coil assembly 12 further includes a supplemental coil set 34 generally coaxially aligned with the axis 18, disposed within the housing 14 radially towards the first circumferential outside surface 20, and radially spaced apart from the main coil set 28. The supplemental coil set 34 includes, in order of decreasing radial distance from the axis 18, adjacently radially spaced-apart and generally annular-shaped superconductive first, second, and third supplemental coils 36, 38, 40. A coil set is said to be radially spaced from another coil set when each coil of the one coil set is radially spaced apart from each coil of the other coil set. The second supplemental coil 38 carries an electric current in the first direction (i.e., in the same direction as the electric currents carried in each of the first and second main coils 30 and 32). The first and third supplemental coils 36 and 40 each carry an electric current in a direction opposite to the first direction.

It is preferred that the electric currents of the first and second main coils 30 and 32 and the first, second and third supplemental coils 36, 38 and 40 are generally equal in amperage. As seen in FIG. 2, in the first preferred embodiment of the invention all of the main coils 30 and 32 and all of the supplemental coils 36, 38 and 40 are disposed longitudinally generally midway between the first and second annular outside surfaces 24 and 26.

The main and supplemental coils each typically would comprise a superconductive wire or superconductive tape wound such that the coil has a longitudinal thickness (longitudinal extension) and a radial thickness (radial extension) far greater than the corresponding dimensions of the superconductive wire or superconductive tape. Preferably, a main coil which is radially closer to the axis 18 than another main coil has an equal or smaller longitudinal thickness and a smaller radial thickness than the other main coil. Thus, the second main coil 32 preferably has an equal or smaller longitudinal thickness and a smaller radial thickness than does the first main coil 30. Similarly, it is preferred that a supplemental coil that is radially closer to the axis 18 than another supplemental coil has a smaller longitudinal thickness and a smaller radial thickness than the other supplemental coil. Thus, the third supplemental coil 40 preferably has a smaller longitudinal thickness and a smaller radial thickness than does the second supplemental coil 38, and the second supplemental coil 38 has a smaller longitudinal thickness and a smaller radial thickness than does the first supplemental coil 36.

Applicants mathematically designed the magnet 10 (such design to be hereinafter described) to have a generally spherical imaging volume 42 (shown as a dotted circle in FIG. 2) centered generally on the axis 18 generally longitudinally midway between the first and second annular outside surfaces 24 and 26. The spherical imaging volume 42 was designed to have a magnetic field of generally 0.5 Tesla, a design peak-to-peak magnetic field inhomogeneity of less than 11 parts per million (ppm), and a diameter of generally 10 centimeters. Such design was made by Applicants using the principles of the first embodiment of the present invention, previously disclosed herein, together with conventional magnetic field analysis, as is within the skill of the artisan. The magnet 10 was conventionally cryocooler-cooled using a typical two-stage cryocooler coldhead and conventionally housed using a thermal shield within the housing 14 which was a vacuum enclosure, such cryocooler cooling and thermal shield being conventional and not shown in the figures. It is noted that the thermal shield may be constructed from copper wire composite, the vacuum enclosure may be constructed from fiber re-enforced epoxy, a stainless steel tape vapor barrier may be wound within the vacuum enclosure, and multi-layer insulation may be placed between the thermal shield and the vacuum enclosure.

The designed magnet 10 had its housing 14 with the first circumferential outside surface 20 having a diameter of generally 22 centimeters, and wherein the radial thickness was generally 39 centimeters and the longitudinal thickness was generally 7 centimeters. The first and second main coils 30 and 32 and the first, second and third supplemental coils 36, 38 and 40 were each generally longitudinally centered between the first and second annular outside surfaces 24 and 26 with each coil containing generally 0.12-inch wide and generally 0.01-inch thick Nb—Sn superconductive tape at a temperature of generally 10 Kelvin with an electric current having an amperage of generally 150 amperes. The first main coil 30 extended longitudinally generally 5.0 centimeters, extended radially generally 7.5 centimeters, was radially disposed generally 42.5 centimeters from the axis 18, and had generally 8,600 meters of the superconductive tape. The second main coil 32 extended longitudinally generally 5.0 centimeters, extended radially generally 2.5 centimeters, was radially disposed generally 38.9 centimeters from the axis 18, and had generally 2,600 meters of the superconductive tape. The first supplemental coil 36 extended longitudinally generally 5.0 centimeters, extended radially generally 3.2 centimeters, was radially disposed generally 20.3 centimeters from the axis 18, and had generally 1,800 meters of said tape. The second supplemental coil 38 extended longitudinally generally 3.0 centimeters, extended radially generally 2.0 centimeters, was radially disposed generally 14.6 centimeters from the axis 18, and had generally 500 meters of the superconductive tape. The third supplemental coil 40 extended longitudinally generally 2.4 centimeters, extended radially generally 0.8 centimeters, was radially disposed generally 13.1 centimeters from the axis 18, and had generally 120 meters of the superconductive tape.

It is noted that because of the magnetic interaction of the unique supplemental coil set with the main coil set, the designed magnet 10 had a larger spherical imaging volume diameter (10 centimeters) than the housing's longitudinal thickness (7 centimeters) which improves breast imaging over conventional spherical imaging volumes whose diameters are smaller than the housing's longitudinal thickness.

In a second preferred embodiment of the invention, shown in FIG. 3, a pancake magnetic resonance imaging (MRI) magnet 44 is seen to be similar to the magnet 10 of the first preferred embodiment shown in FIG. 2. Here, the main coil set 46 includes a first, second and third main coil 48, 50 and 52. The number of main coils is determined by the desired strength of the magnetic field of the magnet together with the critical current density of the superconductor used in the coils. It is noted that by adding enough additional main coils, a generally spherical-shaped imaging volume will become a generally ellipsoidal-shaped imaging volume. The magnet 44 has an ellipsoidal imaging volume 60 (shown as a dotted circle in FIG. 3) which is centered generally on the longitudinal axis 62 and which is longitudinally wider than the longitudinal thickness of the housing 64.

In the second preferred embodiment, the first main coil 48 and the first, second, and third supplemental coils 54, 56 and 58 are each disposed longitudinally towards the first annular outside surface 66. By longitudinally offsetting such coils, the ellipsoidal imaging volume 60 extends longitudinally further beyond the first annular outside surface 66 than the second annular outside surface 68. Such longitudinally-offset, ellipsoidal imaging volume has a shape and location better suited to breast imaging than does a conventional spherical imaging volume of a conventional MRI magnet. It is noted that for the second preferred embodiment, the supplemental coil set 70 further includes fourth and fifth supplemental coils 72 and 74, as shown in FIG. 3. It is noted that the magnet 44 can be mathematically designed to have a specific longitudinally-offset, ellipsoidal imaging volume which is longitudinally wider than the longitudinal thickness of the housing 64 by using the principles of the second embodiment of the present invention, previously disclosed herein, together with conventional magnetic field analysis, as is within the skill of the artisan.

Recent studies indicate that using the contrast agent Gd-DTPA with MRI imaging gives better detection and characterization of breast lesions than with X-ray mammography. The magnet 10 and 44 of the invention provides a pancake MRI magnet design with a modified imaging volume better suited to breast imaging than the imaging volumes of conventional MRI magnets. In addition, the magnet of the invention provides for improved patient and physician access during MRI-guided biopsy as well as during MRI imaging.

As is known to those skilled in the art, a conventional gradient coil, radio frequency (RF) coil, and RF shielding must be designed and operatively connected to the magnet 10 and 44 to actually perform MRI imaging.

The foregoing description of two preferred embodiments of the invention has been presented for purposes of illustration. It is not intended to be exhaustive or to limit the invention to the precise forms disclosed, and obviously many modifications and variations are possible in light of the above teaching. For example, the superconductive coil assembly of the magnet of the invention is not limited to being cryocooler-cooled, and may be liquid-helium (or other cryogenic) cooled. It is intended that the scope of the invention be defined by the claims appended hereto.

We claim:

1. A pancake magnetic resonance imaging magnet comprising a superconductive coil assembly including:

a) a generally toroidal-shaped coil housing surrounding a bore, having a generally longitudinal axis, having a radial thickness between a first generally-circumferential outside surface facing generally towards said axis and a radially spaced-apart second generally-circumferential outside surface facing generally away from said axis, and having a longitudinal thickness between longitudinally spaced-apart first and second generally-annular outside surfaces facing generally away from each other, wherein said radial thickness is greater than said longitudinal thickness;

b) a main coil set generally coaxially aligned with said axis and disposed within said housing radially towards said second circumferential outside surface, said main coil set including a generally annular-shaped superconductive first main coil carrying an electric current in a first direction; and c) a supplemental coil set generally coaxially aligned with said axis, disposed within said housing radially towards said first circumferential outside surface, and radially spaced apart from said main coil set, said supplemental coil set including, in order of decreasing radial distance from said axis, adjacently radially spaced-apart and generally annular-shaped superconductive first, second, and third supplemental coils, said second supplemental coil carrying an electric current in said first direction and said first and third supplemental coils each carrying an electric current in a direction opposite to said first direction.

2. The magnet of claim 1, wherein said radial thickness is at least equal to generally four times said longitudinal thickness.

3. The magnet of claim 1, wherein said electric currents of said first main coil and said first, second and third supplemental coils are generally equal in amperage.

4. The magnet of claim 1, wherein said first main coil is alone within a space defined by moving said first main coil longitudinally between said first and second annular outside surfaces.

5. The magnet of claim 4, wherein said first main coil is disposed longitudinally towards one of said first and second annular outside surfaces.

6. The magnet of claim 5, wherein said first, second and third supplemental coils are each disposed longitudinally towards said one of said first and second annular outside surfaces.

7. The magnet of claim 4, wherein said main coil set includes a second main coil adjacently radially spaced apart from and disposed radially inward of said first main coil, said second main coil carrying an electric current in said first direction.

8. The magnet of claim 7, wherein said electric currents of said first and second main coils and said first, second and third supplemental coils are generally equal in amperage.

9. The magnet of claim 5, wherein said second main coil is alone within a space defined by moving said second main coil longitudinally between said first and second annular outside surfaces.

10. The magnet of claim 9, wherein:

a) said housing is a vacuum enclosure with said first circumferential outside surface having a diameter of generally 22 centimeters, and wherein said radial thickness is generally 39 centimeters and said longitudinal thickness is generally 7 centimeters; and b) said first and second main coils and said first, second and third supplemental coils are each generally longitudinally centered between said first and second annular outside surfaces with each containing generally 0.12-inch wide and generally 0.01-inch thick Nb—Sn superconductive tape at a temperature of generally 10 Kelvin with an electric current having an amperage of generally 150 amperes, with:

(1) said first main coil extending longitudinally generally 5.0 centimeters, extending radially generally 7.5 centimeters, radially disposed generally 42.5 centimeters from said axis, and having generally 8,600 meters of said tape;

(2) said second main coil extending longitudinally generally 5.0 centimeters, extending radially generally 2.5 centimeters, radially disposed generally 38.9 centimeters from said axis, and having generally 2,600 meters of said tape;

(3) said first supplemental coil extending longitudinally generally 5.0 centimeters, extending radially generally 3.2 centimeters, radially disposed generally 20.3 centimeters from said axis, and having generally 1,800 meters of said tape;

(4) said second supplemental main coil extending longitudinally generally 3.0 centimeters, extending radially generally 2.0 centimeters, radially disposed generally 14.6 centimeters from said axis, and having generally 500 meters of said tape; and (5) said third supplemental main coil extending longitudinally generally 2.4 centimeters, extending radially generally 0.8 centimeters, radially disposed generally 13.1 centimeters from said axis, and having generally 120 meters of said tape, whereby said magnet has a generally spherical imaging volume generally centered on said axis generally longitudinally midway between said first and second annular outside surfaces, with said spherical imaging volume having a magnetic field of generally 0.5 Tesla, a design peak-to-peak magnetic field inhomogeneity of less than 11 parts per million, and a diameter of generally 10 centimeters.

* * * * *